United States Patent [19]

Knecht

[11] Patent Number: 5,030,875
[45] Date of Patent: Jul. 9, 1991

[54] SACRIFICIAL QUARTZ CRYSTAL MOUNT

[75] Inventor: Thomas A. Knecht, Crystal Lake, Ill.

[73] Assignee: Motorola, Inc., Schaumburg, Ill.

[21] Appl. No.: 470,484

[22] Filed: Jan. 26, 1990

[51] Int. Cl.$^5$ .......................................... H01L 41/08
[52] U.S. Cl. .................................... 310/346; 310/344; 310/351
[58] Field of Search ............... 310/346, 348, 351–353, 310/344

[56] References Cited

U.S. PATENT DOCUMENTS

| | | | |
|---|---|---|---|
| 3,046,423 | 7/1962 | Wolfskill et al. | 310/346 |
| 3,754,153 | 8/1973 | Carpenter et al. | 310/346 X |
| 3,805,098 | 4/1974 | Carpenter et al. | 310/346 X |
| 3,876,891 | 4/1975 | Schubotz | 310/346 |
| 3,906,260 | 9/1975 | Oguchi | 310/346 |
| 4,266,157 | 5/1981 | Peters | 310/346 X |
| 4,317,059 | 2/1982 | Besson | 310/346 X |
| 4,418,299 | 11/1983 | Momosaki | 310/346 X |
| 4,608,510 | 8/1986 | Dinger et al. | 310/346 X |
| 4,626,732 | 12/1986 | Debaisieux et al. | 310/346 X |

FOREIGN PATENT DOCUMENTS 0202509 9/1986 Japan ..................................... 310/346

Primary Examiner—Mark O. Budd
Attorney, Agent, or Firm—Joseph P. Krause

[57] ABSTRACT

In a conventional quartz crystal resonator, a sacrificial quartz layer attached to the mounting posts and between the active, vibrating quartz layer and the package base reduces mechanical stresses on the active quartz layer caused by thermal expansion coefficient differences. The intermediate quartz layer is a sacrificial layer which acts to maintain the spacing of mounting posts.

16 Claims, 1 Drawing Sheet

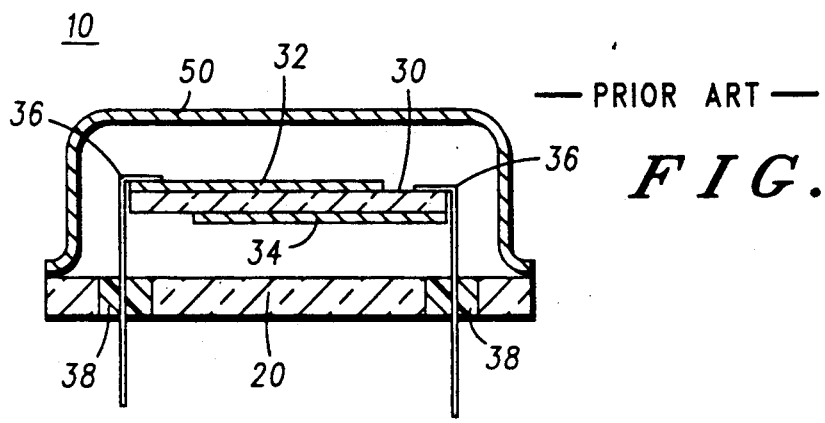
— PRIOR ART —
FIG.1
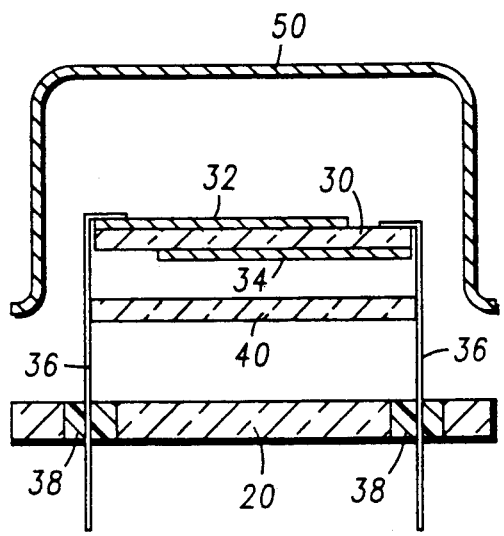
FIG.2
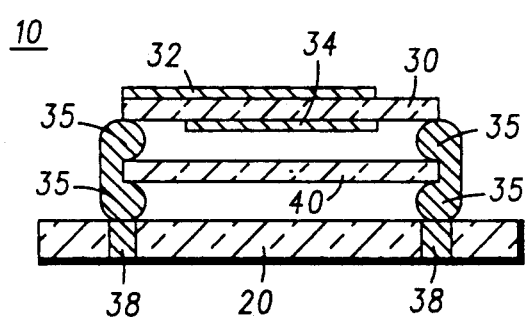
FIG.3
FIG.4
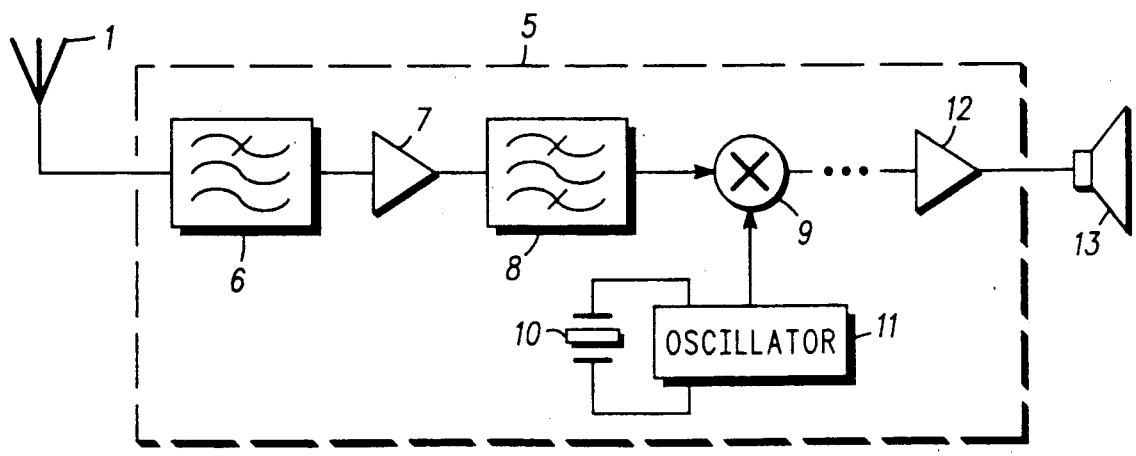

ial with a cut orientation matched to that of the active plate (30) however other crystal cuts may be used.

SACRIFICIAL QUARTZ CRYSTAL MOUNT

BACKGROUND OF THE INVENTION

This invention relates to crystal mounting structures. In particular this invention relates to crystal mounting structures that reduce mechanical stresses in a piezoelectric quartz crystal resonator.

FIG. 1 shows a representative cross-sectional diagram of a typical prior art piezoelectric quartz crystal resonator (10). A package base (20), which is typically metallic but may also be glass or ceramic, supports a piezoelectric quartz resonator element (30) which includes two electroded surfaces (the electrodes are shown as elements 32 and 34) supported between two fixed mounting posts (36) as shown.

The piezoelectric quartz crystal resonator (10) includes a thin piece of quartz (30), typically only a few thousandths of an inch thickness having a predetermined cut orientation (such as an AT-cut or GT-cut as they are known in the art). The cut orientation, and other physical dimensions and the electrode dimension establish the resonant frequency of the resonator (10). The piezoelectric quartz resonator element (30) typically has a thermal expansion coefficient of anywhere between 5 and 30 parts per million per degree centigrade although values between 10 and 20 parts per million per degree centigrade are more typical. The package base (20) on the other hand, which is typically metallic, has a thermal expansion coefficient of between 2 and 10 parts per million per degree centigrade.

In fabricating a crystal resonator (10) as shown in FIG. 1, the electrodes (32 and 34) on the quartz crystal plate (30) are attached to the mounting posts (36) by an appropriate adhesive. Conductive epoxy or solder may be used to attach the mounting posts (36) to the electrodes (32 and 34). To cure the adhesive used to join the mounting posts (36) to the electrodes (32 and 34), or to flow metal-based solders to join the posts to the electrodes, the quartz crystal resonator (10) usually must be heated to an elevated temperature. When heated the package base and quartz crystal plate expand, albeit at different rates and when cooled after the adhesive sets, the mechanical joints existing between the mounting posts create mechanical stresses in the quartz (30) because of the differences in thermal expansion coefficients. Since the thermal expansion coefficients of the package base (20) and the quartz crystal plate (30) are different, the physical dimensions of the pieces will change as their temperature shifts.

Alternate schemes of mounting the quartz crystal resonator (30) to a package base (20) include using a quartz material for the package base (20) which would have a substantially identical thermal expansion coefficient. The cost of using quartz for the package base creates other problems including expense and hermetically sealing the crystal resonator (10).

A crystal mounting structure which reduces mechanical stresses on the piezoelectric quartz crystal resonator at a reasonable cost would be an improvement over the prior art.

SUMMARY OF THE INVENTION

There is provided a crystal resonator that has a piezoelectric quartz crystal plate suspended from the package base by cantilevered mounting posts fixed to the base. The crystal resonator includes an intermediate layer of material, preferably similar in size and material to the crystal plate, which is also fixed to the mounting posts, between the crystal plate and package base. When the intermediate layer is attached to the mounting posts between the package base and crystal plate, it isolates the crystal plate from mechanical stresses caused by differences in thermal expansion coefficients by fixing the position of the mounting posts with respect to the crystal plate and absorbing mechanical stresses that the crystal plate would previously have to absorb.

BRIEF DESCRIPTION OF THE DRAWINGS

FIG. 1 shows a representative cross-sectional diagram of a prior art crystal resonator.

FIG. 2 shows a cross-sectional diagram of a preferred embodiment of the invention.

FIG. 3 shows an alternate embodiment of the invention.

FIG. 4 shows a partial block diagram of a communications device or radio that might use a quartz crystal resonator as shown in FIGS. 2 and 3.

DETAILED DESCRIPTION OF THE PREFERRED EMBODIMENT

FIG. 2 shows a cross-sectional diagram of the preferred embodiment of the quartz crystal resonator (10) that uses a sacrificial quartz layer (40). A package base (20) with a first thermal expansion coefficient supports an electroded piezoelectric quartz crystal plate (30) (also referred to as the active plate (30)). The active plate includes (30) electrodes (32 and 34) to which are applied electrical signals that cause the active plate (30) to vibrate at some frequency. (The vibration frequency of the active plate (30) will be affected by the geometry of the plate, the thickness of the electrodes, the atmosphere surrounding the plate, and other factors.) Electrical signals are usually carried to the electrodes (32 and 34) through the two vertically oriented cantilevered mounting posts (36), which also support the plate (30) mounted to the package base (20) through feed through holes (38). (The mounting posts (36) in an alternate embodiment detailed below and shown in FIG. 3 would include beads or dollops of conductive adhesive.) Electrical signals might also be carried to the electrodes using wires. The package base (20) in the preferred embodiment is ceramic but could be glass, metal, or other suitable material. Ceramic package bases (20) are known to have a thermal expansion coefficient of between 6 and 10 parts per million per degree centigrade.

The active electroded piezoelectric quartz crystal plate (30) typically has a thermal expansion coefficient of approximately 10 to 20 parts per million per degree centigrade. The active plate (30) is typically a quartz crystal plate with a predetermined crystal cut orientation (GT-cut or AT-cut for example). The sacrificial layer will typically have a cut orientation matched to that of the active layer however alternate crystal cuts may be used for the sacrificial layer (40) as economies of the crystal resonator and operating characteristics of the resonator (10) may dictate. These alternate sacrificial layers would typically have preselected physical dimensions (including thickness, length and width).

The sacrificial layer of quartz (40) (which is the intermediate layer in the crystal resonator (10)) is also fixed to the mounting posts (36) but is between the active plate (30) and the package base (20). The sacrificial quartz intermediate layer (40) is preferably quartz crystal having similar dimensions of the quartz crystal plate (30) and preferably with an identical crystal cut orientation such that the mechanical behavior of the sacrificial quartz layer (40) over temperature is substantially identical to the behavior of the active electroded piezoelectric quartz crystal plate (30). Alternate sacrificial layers could include any material with a thermal expansion coefficient between those of the active plate (30) and the package base (20) so as to mitigate stress on the active plate over temperature ranges and with physical dimensions to optimally isolate the active plate (30) from the package base (20).

The mounting posts (36), which in the preferred embodiment are conductive adhesive but could also be metallic, are attached to the active plate (30) and to the sacrificial layer (40) by any appropriate technique and material. The quartz crystal layer (30) and the sacrificial layer (40) may be attached using solder, beads of conductive glass, conductive epoxy, or other appropriate adhesive suitable for the frequency of operation, the crystal cut orientation, and the dimensions of the quartz layers. Alternate embodiments of the invention could include using mounting posts (36) which are conductive epoxy, conductive adhesive with sufficient rigidity to support the sacrificial layer (40) and the active layer (30), solder, or conductive glass, for example. The mounting posts (36) shown in FIG. 2 could be fabricated from any of these alternate materials.

In order to be practically effective, electric signals must of course be conducted between the exterior of the crystal resonator (10) and the active plate (30). The mounting post and the adhesive used to attach the mounting post to the electrodes (32) and (34) on the active quartz crystal layer (30) are a convenient apparatus for conducting electrical signals into and out of the crystal resonator (10). An alternate embodiment would include the use of small wires attached to the electrodes (32 and 34) on the active plate and to conductive feedthroughs on the package base. A mounting hood (50) is usually attached to the package base (20) so that the crystal resonator (10) can be hermetically sealed to protect it from environmental changes.

An alternate embodiment of the crystal resonator (10) is shown in FIG. 3. In this depiction, the intermediate layer (40) is shown attached to the active plate (30) and to the package base (20) using a conductive glass bead (35), for example, or a bead of conductive epoxy. The principal differentiation between the embodiment shown in FIG. 2 and FIG. 3 is the relative spacing between the sacrificial layer (40) and the active layer (30). (The hermetically sealed crystal mount hood (50) is deleted from FIG. 3 for clarity.)

FIG. 4 shows a typical application for the crystal resonator (10) shown in FIGS. 2 and 3. In FIG. 4 an illustrative block diagram of a radio receiver is shown, although those skilled in the art will recognize that more elegant architectures would typically be used today.

A band-pass filter (6) filters signals from an antenna (1) which are then amplified (7) as shown. The output of the first amplifier (7) is also band pass filtered (8) before the signals are coupled into a first mixer stage (9). An oscillator (11), which might also be a synthesizer, uses a crystal resonator (10) (schematically shown in this figure but would be constructed as shown in FIGS. 2 and 3) provides a signal to the mixer (9) that yields a first IF frequency as shown. The first IF signal may be subsequently processed (digitally or using analog techniques), demodulated, and produced for a speaker (13) by another amplifier stage (12). The crystal resonator (10) used in the radio receiver communications device shown in FIG. 4 might be used in other communications devices as well, such as in a radio transmitter or paging device.

When used in a radio communications device, the resonators (10) shown in FIGS. 2 and 3 could be either leaded packages and used with conventional circuit boards or surface mountable packages.

The thermal stability of the crystal resonator (10) is improved by the addition of the intermediate layer (40) by buffering the active layer (30) from mechanical stresses that would be created by differences in the thermal expansion coefficient of the active layer (30) and the package base (20). The structures shown in FIGS. 2 and 3 can be economically manufactured and provide improved performance over wide temperature ranges by virtue of the intermediate sacrificial quartz layer (40).

What is claimed is:

1. A piezoelectric quartz crystal resonator comprised of:
    a package base having a first thermal expansion coefficient;
    an active piezoelectric quartz layer including electroded surfaces and with a second thermal expansion coefficient;
    mounting pedestals coupled to and cantilevered from said package base and coupled to said active piezoelectric quartz layer, said mounting pedestals capable of exerting mechanical stress on said active piezoelectric quartz layer arising from differences between said first and second thermal expansion coefficients; and
    an intermediate layer means coupled to said mounting pedestals and between said active piezoelectric quartz layer and said package base for reducing mechanical stress on said active piezoelectric quartz layer.

2. The resonator of claim 1 where said package is a leaded package.

3. The resonator of claim 1 where said package is surface mountable.

4. The crystal resonator of claim 1 where said intermediate layer means is quartz.

5. The crystal resonator of claim 1 where said first thermal expansion coefficient is between approximately 2 and 10 ppm/degrees C. and said second thermal expansion coefficient is between 10 and 20 ppm/degree C.

6. The crystal resonator of claim 5 where said intermediate layer has a thermal expansion coefficient substantially between said first and second thermal expansion coefficients.

7. The crystal resonator of claim 1 where said mounting base is ceramic.

8. The crystal resonator of claim 1 where said mounting posts are conductive epoxy.

9. The crystal resonator of claim 1 where said mounting posts are conductive adhesive.

10. The communications device of claim 1 where said mounting posts are conductive epoxy.

11. The crystal resonator of claim 1 where said crystal has a predetermined fabrication cut.

12. The crystal resonator of claim 11 where said intermediate layer is quartz with a fabrication cut substantially identical to said fabrication cut of said crystal resonator.

13. The crystal resonator of claim 1 including means for conducting electrical signals to said electroded crystal plate.

14. The crystal resonator of claim 13 where said means for conducting electrical signals includes wires bonded to said electroded crystal plate and said package base.

15. The crystal resonator of claim 13 where said means for conducting electrical signals includes conductive adhesive on said electroded crystal plate, said intermediate layer and said package base.

16. The crystal resonator of claim 1 where said intermediate layer means is coupled to said package base by at least one, first mounting means and said electroded crystal plate is coupled to said intermediate layer by at least one second mounting means.

* * * * *